United States Patent
Bou-Ghazale et al.

(10) Patent No.: US 7,328,415 B2
(45) Date of Patent: Feb. 5, 2008

(54) MODELING BLOCKS OF AN INTEGRATED CIRCUIT FOR TIMING VERIFICATION

(75) Inventors: Silvio E. Bou-Ghazale, Phoenix, AZ (US); Cuong M. Le, Phoenix, AZ (US); Michael S. Jones, Chandler, AZ (US); Timothy J. Fisher, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 1444 days.

(21) Appl. No.: 09/789,196

(22) Filed: Feb. 20, 2001

(65) Prior Publication Data

US 2002/0116695 A1   Aug. 22, 2002

(51) Int. Cl.
*G06F 17/50*   (2006.01)
(52) U.S. Cl. .......................................... 716/6
(58) Field of Classification Search .............. 716/6, 716/2, 18, 3, 5
See application file for complete search history.

(56) References Cited

U.S. PATENT DOCUMENTS

| | | | | |
|---|---|---|---|---|
| 5,191,541 A | * | 3/1993 | Landman et al. | 716/6 |
| 5,355,321 A | * | 10/1994 | Grodstein et al. | 716/6 |
| 5,648,909 A | * | 7/1997 | Biro et al. | 716/6 |
| 6,237,127 B1 | * | 5/2001 | Craven et al. | 716/6 |
| 6,438,731 B1 | * | 8/2002 | Segal | 716/2 |
| 6,496,972 B1 | * | 12/2002 | Segal | 716/18 |

OTHER PUBLICATIONS

M. Nourani et al., False Path Exclusion in Delay Analysis of RTL Structures, IEEE Transactions on VLSI Systems, pp. 30-43, Feb. 2002.*

* cited by examiner

*Primary Examiner*—Leigh M. Garbowski
(74) *Attorney, Agent, or Firm*—Trop, Pruner & Hu, P.C.

(57) ABSTRACT

An integrated circuit may be divided into blocks and analyzed using a modeling algorithm which facilitates the concurrent analysis of a plurality of blocks forming an integrated circuit. In some cases, an electrical connectivity description of a block may be utilized to create static-timing representations that contain the logic that communicates with the boundary of a block. Once the models for the blocks forming an integrated circuit are generated, static-timing analysis may take place concurrently with all the relevant, identified paths.

24 Claims, 4 Drawing Sheets

MODELING BLOCKS OF AN INTEGRATED CIRCUIT FOR TIMING VERIFICATION

BACKGROUND

This invention relates generally to the use of computers in the design of integrated circuits.

An essential step in designing very large scale integrated circuits is ensuring timing verification of all data signals flowing along timing paths within the integrated circuit. Timing verification involves making sure that data signals for all possible relevant paths within an integrated circuit arrive no later than a specified time and no earlier than another specified time with respect to one or more reference signals called clocks.

A common method for analyzing all of the relevant paths in an integrated circuit involves using industry available software called a static-timing tool. The tool identifies all possible timing paths coupled with designer specified irrelevant paths called false paths and other path exceptions such as multi-cycle paths. As a result, with the static-timing tool, irrelevant timing paths need not be analyzed for timing verification.

As integrated circuits increase in size and complexity, a block level strategy may be employed wherein the integrated circuit is divided into a plurality of blocks which may be functional blocks. However conventional static-timing verification techniques are not amenable to block level analysis. This is at least in part because current static-timing verification techniques do not permit the specification of the relevant timing paths at the boundaries of blocks.

Thus there is a need for a new approach to modeling integrated circuits as blocks for static-timing verification that allows exception paths such as irrelevant and multi-cycle paths to be specified at block boundaries.

DETAILED DESCRIPTION

In accordance with one embodiment of the present invention, concurrent static-timing verification may be accomplished wherein integrated circuit level as well as block level static-timing verification may occur at the same time. In some embodiments, this may result in a shortening of the design cycle while increasing designer productivity through automation of block level exception path specifications. Additionally, the resulting static-timing model may represent a certain connectivity at a fraction of the original size, improving the productivity through shorter tool run time and analysis in one embodiment.

In accordance with one embodiment, an electrical connectivity description of a block that forms an overall integrated circuit is used to create a static-timing representation for that block that contains the logic that communicates with the boundary of the block. The connection to a boundary of the block is called a block pin. A block pin connects the block to the exterior of the block. The combinational logic between the block pins and the first sequential element in the block is utilized to develop the model. As used herein, "combinational logic" is any circuit element whose output is not dependent on a clock or reference signal. Conversely, a sequential element is any circuit element that captures, samples or stores at least one data signal based on another reference signal such as a clock.

Thus, in one embodiment, a block may be modeled for timing verification by representing the combinational logic between block pins and the first sequential element encountered in the block, moving inwardly into the block from a block pin, as well as each such first sequential element. In addition, any logic (whether combinational or sequential) involved in creating the clock signals, for elements included in the model, is utilized to derive the model. Also all electrical paths that run from one block pin to another are included in the model.

In accordance with some embodiments, any number of chip blocks may be derived from an overall integrated circuit and analyzed concurrently. These blocks may include hierarchical blocks that include other blocks within them. Once the models for the various functional blocks are generated, a static-timing analysis takes place concurrently for each block in the integrated circuit as a whole. All the relevant paths are identified during setup realizing productivity gains in shortening the design and static-timing verification cycle in some embodiments. This may be an improvement over conventional techniques that may involve stopping the verification cycle upon the generation of the first run time error.

Figure 1:
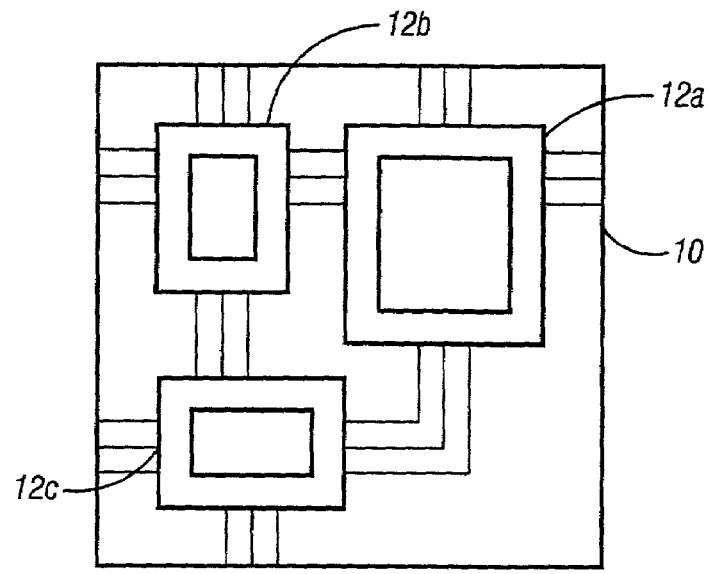
FIG. 1 is a block depiction of an integrated circuit in accordance with one embodiment of the present invention.

Referring to FIG. 1, an exemplary integrated circuit 10 is shown merely to illustrate the application of the modeling principles described above. In this case, the integrated circuit 10 is divided into three functional blocks 12a through 12c. The basis for deriving the functional blocks may be determined to meet the needs of the designer. For example, the blocks may be defined functionally or they may be defined based on how the overall design of the integrated circuit 10 is divided up among design teams. Alternatively, any other technique may be utilized to assign the functional block 12 definitions.

Figure 2:
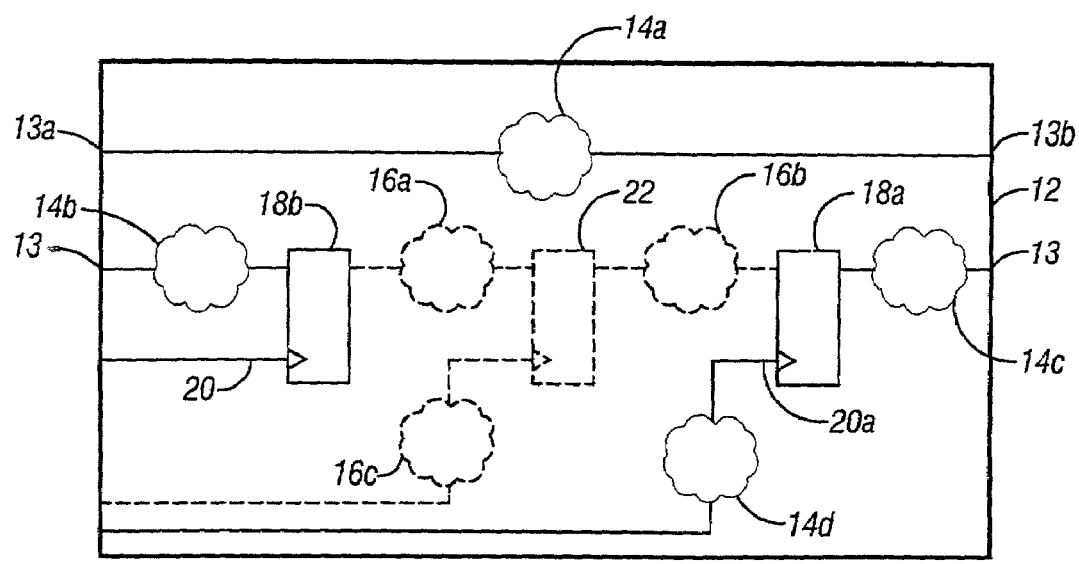
FIG. 2 is a more detailed diagram of one of the blocks shown in FIG. 1 to illustrate an embodiment of the present invention.

Referring to FIG. 2, an exemplary detailed design of the functional block 12c is illustrated. The functional block 12c includes combinational logic 14a which spans from one block pin 13a to another block pin 13b of the block 12c.

In addition, the combinational logic 14b is coupled to a first sequential element 18b which receives a clock signal 20. Similarly, the combinational logic 14c is coupled to first sequential logic 18a which receives a timing signal 20a. The timing signal 20a is generated by the combinational logic 14d.

Each of the block 12c elements shown in FIG. 2 in a bold style is included within the model. The additional elements, shown in dotted lines, are excluded from the model. For example, the combinational logic 16a and 16b fail to meet the inclusion criteria in that they are not situated between a pin 13 and a sequential element 18. Similarly, the sequential element 22 fails to meet the inclusion criteria that it be a first sequential element encountered moving into the block 12 from a block pin 13. As a result, the combinational logic 16c is excluded from the model since it is merely utilized to generate the clock signal for the sequential element 22 which has been excluded.

Any circuit whether a sequential element or combinational logic that creates the timing signal or reference clock for a first sequential element is included in the model. Thus, if the combinational logic 14d was in fact formed by combinational logic and a sequential element, both the combinational logic and sequential element are included in the model. This inclusion principle may supersede the rule that first (but not other) sequential elements are included in the model.

In this way, internal block paths may be excluded from the block's model using a convenient algorithm. Effectively, the internal portions of these blocks may be largely ignored for purposes of timing verification.

Figure 3:
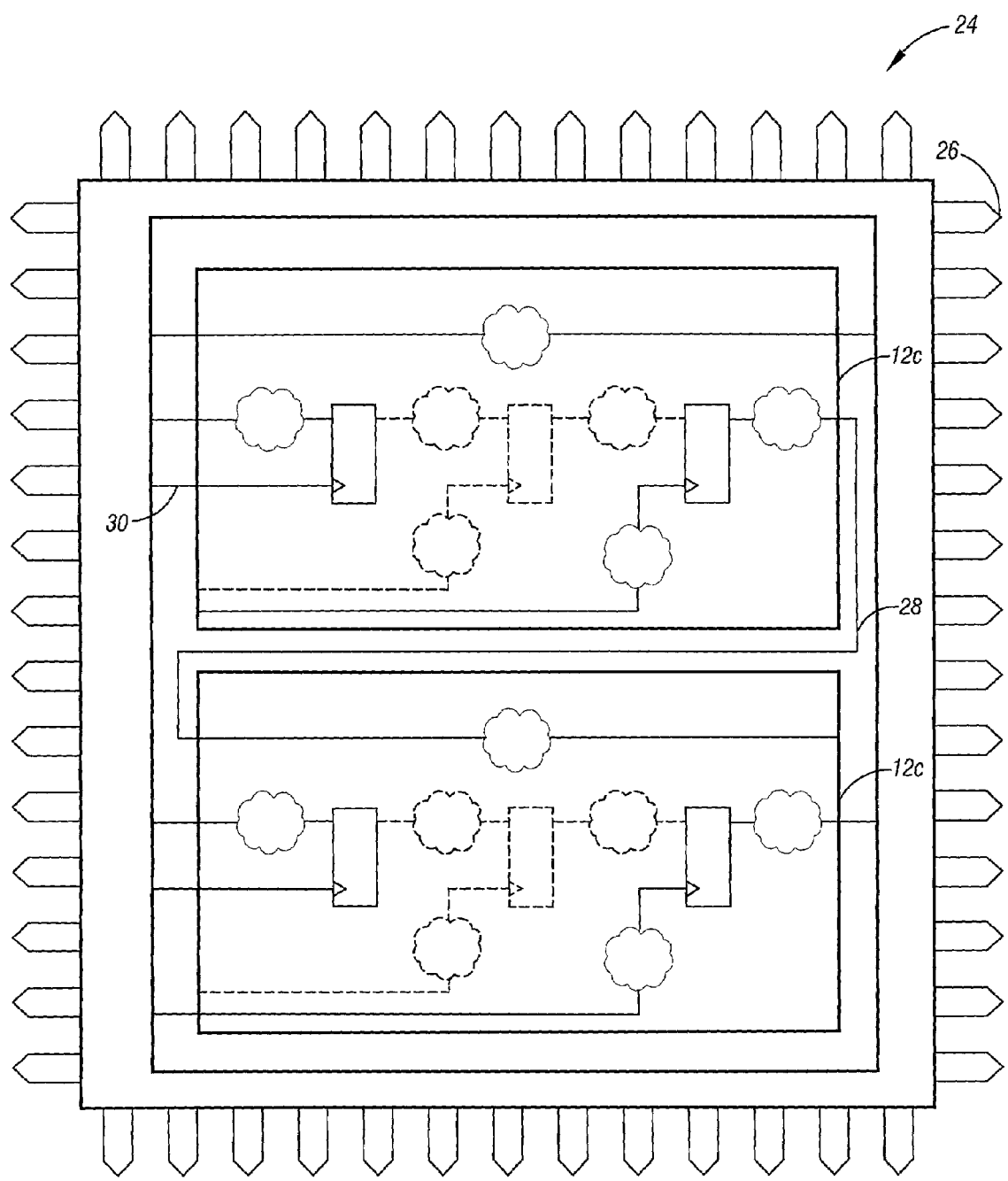
FIG. 3 is a depiction of an integrated circuit to illustrate another embodiment of the present invention.

Turning next to FIG. 3, an integrated circuit 24 may include the blocks 12c as illustrated. In this example, the blocks 12c happen to both be identical. In this case, the interface paths, indicated as 30 and 28 between the blocks 12, are used in the model to enable all interface paths, including one internal to the model, to be visible or utilized at the integrated circuit model level. This allows for full specification of exception paths enabling concurrent verification at all hierarchical levels at one time. In this way, a model may be derived for a block 12 which may be utilized for subsequent designs that use the same block.

Figure 4:
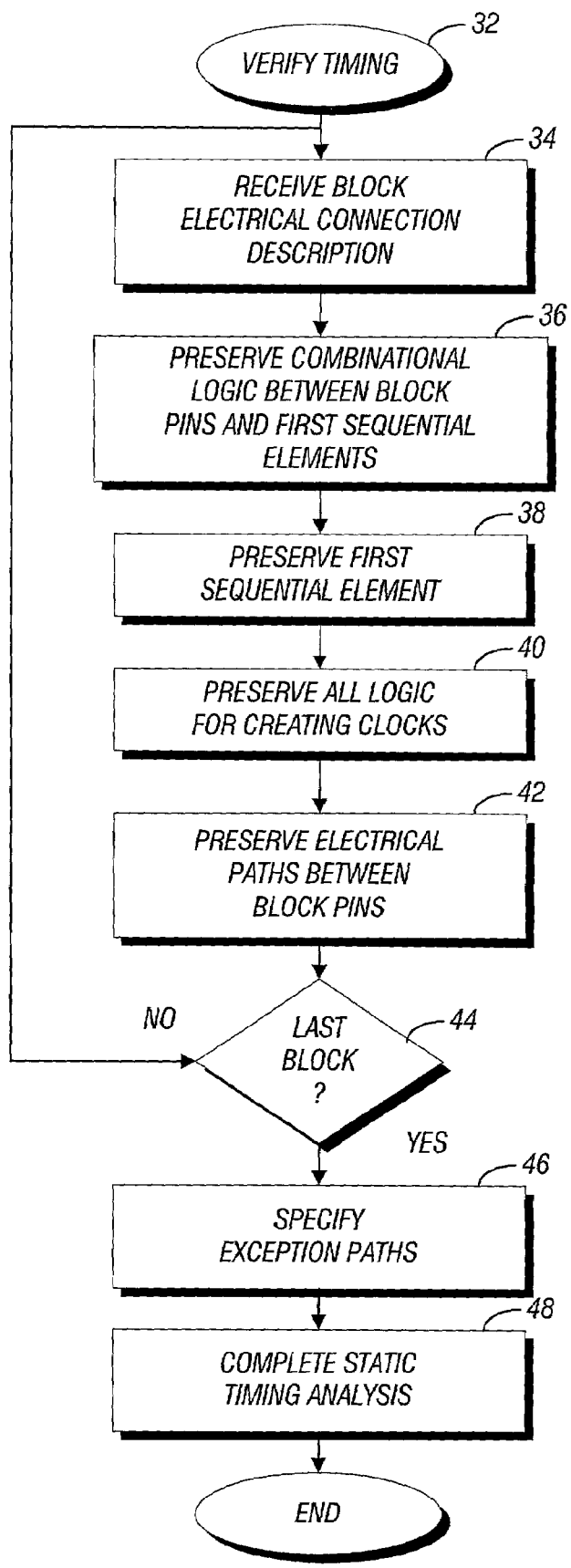
FIG. 4 is a flowchart for software for implementing one embodiment of the present invention.

Referring to FIG. 4, the software 32 for enabling static-timing verification on a block and integrated circuit level concurrently begins by receiving a block electrical connectivity description as indicated at block 34. This connectivity description basically describes the connections and may correspond to a netlist as one example. In any case, the description is an electronic representation of the electrical connections of a given block. The combinational logic between block pins and the first sequential element is preserved or actually utilized to derive the model as indicated in block 36. In addition, the first sequential elements are also utilized in developing the model as indicated in block 38.

Also, the logic for creating clock signals to included elements is utilized in the model as indicated in block 40. Likewise, any electrical paths between block pins are similarly included as indicated in block 42.

All other paths and elements are considered exceptions and are excluded from the model. This enables the generation of a useful model in an efficient fashion in some cases.

A check at diamond 44 determines whether the block which has just been modeled is the last block of an integrated circuit. If not, the flow recycles through each block until a model of each block in the integrated circuit has been developed. At that time, the exception paths may be specified as indicated in block 46 to modify the electrical connectivity description to implement the model. Then the static-timing analysis may be completed to assure that the integrated circuit design meets the timing requirements as indicated in block 48.

Figure 5:
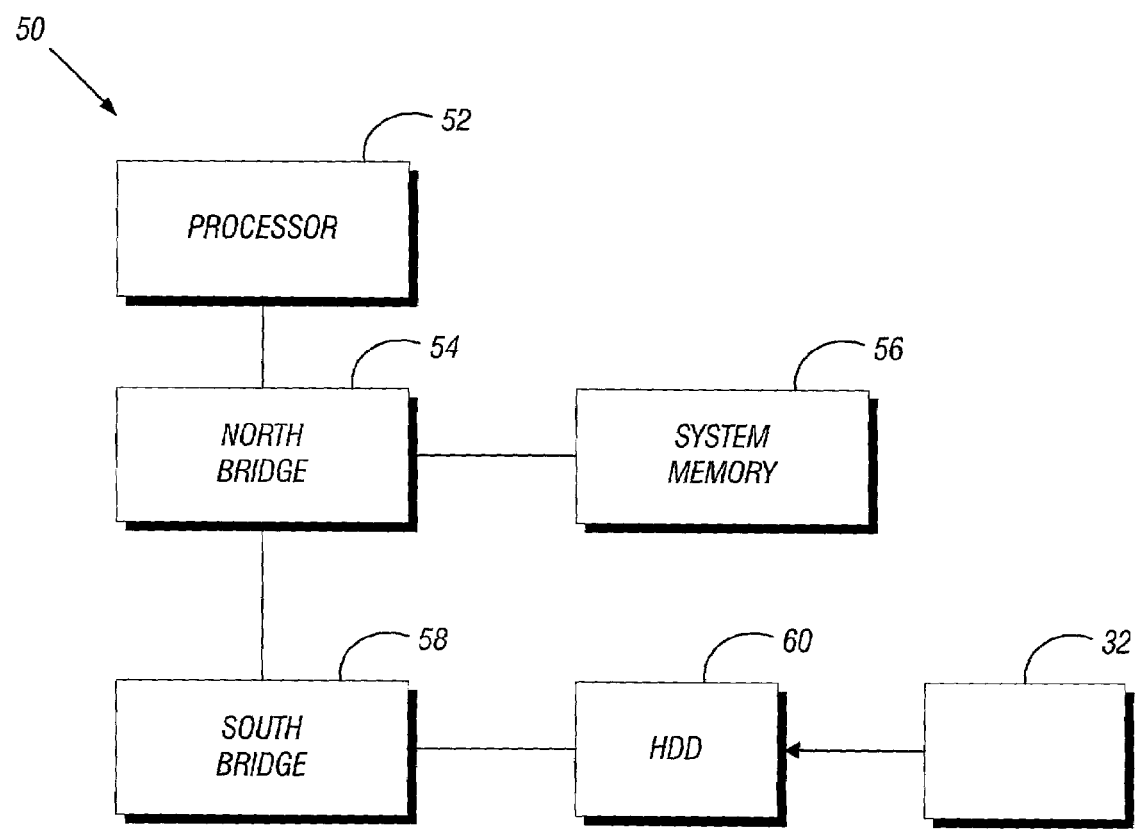
FIG. 5 is a block diagram for one embodiment of the present invention using the software illustrated in FIG. 4.

Referring to FIG. 5, the software 32 may be utilized in a processor-based system 50 to enable computerized design of integrated circuits. A conventional processor-based system 50 may include a processor 52 coupled to bridges 54 and 58. A system memory 56 may be utilized as well. A storage device such as a hard disk drive 60 may store the software 32 for execution by the processor 52. Thus, the software 32 may be stored on an appropriate medium such as a magnetic disk or other known storage medium for execution under control of processor 52 in a processor-based system 50.

The model, derived in accordance with embodiments of the present invention, enables concurrent static-timing verification, while eliminating duplicate or redundant error/warning messages, thereby shortening the design cycle. In some embodiments, a robust block reuse strategy may be used in the static-timing verification area. This may improve time to market and productivity by reusing existing designs that do not necessarily adhere to static-timing reuse guidelines. An accurate timing model may be generated in some embodiments with respect to the electrical circuit specification as opposed to pessimistic black box models. Black box models utilized in accordance with prior art techniques may be overconstrained increasing the design effort and increasing the design time. Moreover, the automatic specification of boundary exception paths avoids inadvertently using exception paths that may result in incorrect or frequency-dependent arc modeling when the embedded block has an internal multi-cycle path at a port or a masked timing violation when either a false path or a masked timing violation where a false path or a multi-cycle path crosses the embedded block boundary.

Thus, in some embodiments, the automation of model creation reduces the manual effort involved in verifying the timing arcs in a block model that truly reflects the netlist. This may reduce the potential human error and effort involved in generating black box models with timing arcs.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   receiving block electrical connectivity information for a plurality of block pins, at least one of said block pins being coupled to one or more sequential elements;
   identifying the first sequential element coupled to said at least one block pin; and
   developing a block model including said first sequential element and the combinational logic between said element and said at least one block pin; and
   excluding from the model combinational logic that is not located between a block pin and a first sequential element.

2. The method of claim 1 including developing a block model including logic for creating the clocks for the first sequential element.

3. The method of claim 1 including developing a block model including electrical paths between block pins.

4. The method of claim 1 including specifying exception paths.

5. The method of claim 1 including developing a block model for a plurality of different blocks that make up an integrated circuit and completing a static timing analysis for each block and the circuit.

6. The method of claim 1 including developing a block model by excluding an electrical path that does not extend between two block pins.

7. The method of claim 1 including developing a block model that excludes from the model a sequential element that is not the first sequential element coupled to a block pin.

8. The method of claim 7 including developing a block model by excluding from the model a circuit for creating a clock signal for a sequential element that is not the first sequential element connected to a block pin.

9. The method of claim 7 including in the model a sequential element that is not the first sequential element coupled to a block pin if the sequential element develops a reference signal for a first sequential element.

10. An article comprising a medium storing instructions that enable a processor-based system to:
  receive block electrical connectivity information for a plurality of block pins, including at least one block pin coupled to one or more sequential elements;
  identify the first sequential element coupled to said at least one block pin; and
  develop a block model including said first sequential element and the combinational logic between the element and said at least one block pin; and
  exclude a sequential element that is not the first sequential element coupled to a block pin.

11. The article of claim 10 further storing instructions that enable the processor-based system to develop a block model including logic for creating clocks.

12. The article of claim 10 further storing instructions that enable the processor-based system to develop a block model including electrical paths between block pins.

13. The article of claim 10 further storing instructions that enable the processor-based system to specify exception paths.

14. The article of claim 10 further storing instructions that enable the processor-based system to develop a block model for a plurality of different blocks that make up an integrated circuit and complete a static timing analysis for each block and the circuit.

15. The article of claim 10 further storing instructions that enable the processor-based system to develop a block model that excludes from the model combinational logic that is not located between a block pin and a first sequential element.

16. The article of claim 10 further storing instructions that enable the processor-based system to develop a block model by excluding an electrical path that does not extend between two block pins.

17. The article of claim 10 further storing instructions that enable the processor-based system to develop a block model by excluding from the model a circuit for creating a clock signal for a sequential element that is not the first sequential element connected to a block pin.

18. The article of claim 10 further storing instructions that enable the processor-based system to include in the block model a sequential element coupled to a block pin if the sequential element develops a reference signal for a first sequential element.

19. A system comprising:
  a processor; and
  a storage coupled to said processor, said storage storing instructions that enable the processor to receive block electrical connectivity information for a plurality of block pins, including at least one block pin coupled to one or more sequential elements, identify the first sequential element coupled to said at least one block pin, develop a block model including the first sequential element and the combinational logic between the element and said at least one block pin, and exclude from the model a combinational logic that is not located between a block pin and a first sequential element.

20. The system of claim 19 wherein said storage further stores instructions that enable the processor to develop a block model including logic for creating the clocks for the first sequential element.

21. The system of claim 19 wherein said storage stores instructions that enable the processor to develop a block model including electrical paths between block pins.

22. The system of claim 19 wherein said storage stores instructions that enable the processor to specify exception paths.

23. The system of claim 19 wherein said storage stores instructions that enable the processor to develop a block model for a plurality of different blocks that make up an integrated circuit and complete a static timing analysis for each block and the circuit.

24. The system of claim 19 wherein said storage stores instructions that enable the processor to develop a block model by excluding an electrical path that does not extend between two block pins.

* * * * *